United States Patent [19]

Ker

[11] Patent Number: 5,754,381

[45] Date of Patent: May 19, 1998

[54] OUTPUT ESD PROTECTION WITH HIGH-CURRENT-TRIGGERED LATERAL SCR

[75] Inventor: Ming-Dou Ker, Hsinchu, Taiwan

[73] Assignee: Industrial Technology Research Institute, Hsinchu, Taiwan

[21] Appl. No.: 794,845

[22] Filed: Feb. 4, 1997

[51] Int. Cl.$^6$ ............................................. H02H 9/00
[52] U.S. Cl. ................................. 361/56; 361/91
[58] Field of Search ............................ 361/18, 54, 56, 361/58, 91, 88, 93, 98, 100, 101, 110, 111, 118, 119, 126, 127; 257/107, 109, 110, 112, 141, 162, 173, 355, 356, 357

[56] References Cited

U.S. PATENT DOCUMENTS

| | | | |
|---|---|---|---|
| 4,734,752 | 3/1988 | Liu et al. | 357/23.4 |
| 5,019,888 | 5/1991 | Scott et al. | 357/41 |
| 5,218,222 | 6/1993 | Roberts | 257/362 |
| 5,270,565 | 12/1993 | Lee et al. | 257/358 |
| 5,329,143 | 7/1994 | Chan et al. | 257/173 |
| 5,600,525 | 2/1997 | Avery | 361/56 |

OTHER PUBLICATIONS

Duvvury et al., "ESD: A pervasive Reliability Concern for IC Technologies", Proceedings of the IEEE, 81(5):690–702, (1993) May.

Chatterjee et al., "A Low–Voltage Triggering SCR for On–Chip ESD Protection at Output and Input Pads" IEEE Electron Device Letters, 12(1):21–22, (1991) Jan.

Chatterjee et al., "A Low–Voltage Triggering SCR for On–Chip ESD Protection at Output and Input Pads", IEEE, Symposium on VLSI Technology, 75–76, (1990) No Month.

Ming–Dou Ker et al., "Area–Efficient CMOS Output Buffer with Enhanced High ESD Reliability for Deep Submicron CMOS ASIC", IEEE, 123–126, (1995) No Month.

Ming–Dou Ker et al., "Complementary–LVTSCR ESD Protection Circuit for Submicron CMOS VLSI/ULSI", IEEE Transactions on Electron Devices, 43(4):1–12, (1996) Apr.

Johnson et al., "Two Unusual HBM ESD Failure Mechanisms on a Mature CMOS Process", EOS/ESD Symposium 93–225, 5B.4.1–5B.4.7, No Date.

Primary Examiner—Ronald W. Leja
Attorney, Agent, or Firm—Fish & Richardson P.C.

[57] ABSTRACT

An output buffer in a CMOS circuit includes an output pad; a VDD line which supplies a first supply voltage; a VSS line which supplies a second supply voltage; a first MOS device connected between the VDD line and the output pad; a second MOS device connected between the VSS line and the output pad; a lateral SCR device connected from the output pad to one of the VDD and VSS lines and in parallel with one of the first and second MOS devices; and a bypass diode connected to the other of the VDD and VSS lines and to the lateral SCR device.

7 Claims, 14 Drawing Sheets

OUTPUT ESD PROTECTION WITH HIGH-CURRENT-TRIGGERED LATERAL SCR

BACKGROUND OF THE INVENTION

The invention relates generally to output ESD protection for a CMOS output buffer.

ESD (Electrostatic Discharge) protection and its impact on the reliability of IC products in submicron CMOS technologies has become a primary concern. On-chip ESD protection circuits are often connected to both the input and output pads of an IC product to avoid ESD damage. In particular, the drains of NMOS and PMOS devices in the CMOS output buffer are often directly connected to the output pad driving the external load, making the CMOS output buffer more vulnerable to ESD stress. To improve the ESD robustness of a CMOS output buffer and to handle high driving or sinking currents to and from an external heavy load, the output NMOS and PMOS devices are often designed to have large device dimensions. Even in a device having such large dimensions, the ESD robustness of a CMOS output buffer can be still seriously degraded in advanced submicron CMOS technologies. The issues of ESD robustness has been reported in the following papers:

- C. Duvvury, R. N. Rountree, Y. Fong, and R. A. McPhee, "ESD phenomena and protection issues in CMOS output buffers," Proc. of IRPS, 1987, pp. 174–180.
- C. Duvvury and A. Amerasekera, "ESD: A pervasive reliability concern for IC technologies," Proc. of IEEE, vol. 81, no. 5, pp. 690–702, 1993.
- A. Amerasekera and C. Duvvury, "The impact of technology scaling on ESD robustness and protection circuit design,' 1994 EOS/ESD Symp. Proc., EOS-16, pp. 237–245.
- C. Duvvury, R. McPhee, D. Baglee, and R. Rountree, "ESD protection in 1 μm CMOS technologies," Proc. of IRPS, 1986, pp. 199–205.

From another practical consideration, the pin counts of high-integration CMOS VLSI/ULSI devices are often greater than 200. With such high pin-count CMOS IC's, the available layout area for each output (or input) pad with output buffer (or input ESD protection circuit) including latchup guard rings is seriously limited.

Recently, lateral SCR devices have been used as ESD-protection elements to provide input protection in submicron CMOS IC's, as described in the following papers:

- R. N. Rountree, "ESD protection for submicron CMOS circuits: issues and solutions,' 1988 IEDM Technical Digest, pp. 508–583.
- C. Duvvury and R. N. Rountree, "A synthesis of ESD input protection scheme," 1991 EOS/ESD Symp. Proc., EOS-13, pp. 88–97.
- C.Y. Wu, M.D. Ker, C.Y. Lee, and J. Ko., "A new on-chip ESD protection circuit with dual parasitic SCR structures for CMOS VLSI," IEEE Journal of Solid-State Circuits, vol. 27, no. 3, pp. 274–280, 1992.
- M.D. Ker and C.Y. Wu, "Complementary-SCR ESD protection circuit with interdigitated finger-type layout for input pad of submicron CMOS IC's," IEEE Trans. Electron Devices, vol. 42, no. 7, pp. 1297–1304, 1995.

The lateral SCR device was found to provide the highest ESD protection capability in a small layout area, relative to other ESD protection elements such as diodes, thick-oxide devices, gate-oxide devices, or parasitic bipolar devices in submicron CMOS IC's (see M.D. Ker, C.Y. Wu, T. Cheng, M. Wu, T.L. Yu, and A. Wang "Whole-chip ESD protection for CMOS VLSI/ULSI with multiple power pins," Proc. of 1994 IEEE International integrated Reliability Workshop, pp. 124–128). To effectively protect the CMOS output buffer, the use of a low-voltage triggering SCR (LVTSCR) device with much lower trigger voltages has been reported in the following papers:

- A. Chatterjee and T. Polgreen, "A low-voltage triggering SCR for on-chip ESD protection at output and input pads," 1990 Proc. Symposium on VLSI Technology, pp. 75–76.
- A. Chatterjee and T. Polgreen, "A low-voltage triggering SCR for on-chip ESD protection at output and input pads," IEEE Electron Device Letters, vol. 12, no. 1, pp. 21–22, Jan. 1991.
- M.D. Ker, K.F. Wang, M.C. Joe, Y.H. Chu, and T.S. Wu, "Area-efficient CMOS output buffer with enhanced high ESD reliability for deep submicron CMOS ASIC," Proc. of 8th IEEE International ASIC Conference and Exhibit, 1995, pp. 123–126.
- M.D. Ker, C.Y. Wu, M. and H.H. Chang, "Complementary-LVTSCR ESD protection circuit for submicron CMOS VLSI/ULSI," IEEE Trans. Electron Devices, vol. 43, no. 4, pp. 588–598, 1996.

The trigger voltage of the LVTSCR device is equivalent to the snapback-trigger voltage of a short-channel NMOS (or PMOS) device, which is inserted into the lateral SCR structure, rather than the original switching voltage (about 30–50V) of a lateral SCR device. The shorter channel length of the inserted NMOS (or PMOS) leads to a lower snapback-trigger voltage of the LVTSCR device.

To protect the output transistors in a CMOS output buffer, the inserted NMOS (or PMOS) in the LVTSCR device should be designed with a shorter channel length than the output NMOS (or PMOS) in the CMOS output buffer. Thus, the trigger voltage of the LVTSCR can be lower than the snapback-trigger voltage of the output NMOS (or PMOS).

Referring to FIGS. 1A, 1B and 1C, the schematic device structure, device I–V characteristics, and circuit diagram are shown, respectively, for a lateral SCR (LSCR) device which provides input ESD protection. The trigger voltage (current) of the LSCR device in the CMOS technology is about ~50V (~10 mA).

Referring to FIGS. 2A, 2B and 2C, the schematic device structure, device I-V characteristics, and circuit diagram, are shown, respectively, for a modified lateral SCR (MLSCR) device which provides input ESD protection. The trigger voltage (current) of the MLSCR in the CMOS technology is about ~25V (~10mA).

Referring to FIGS. 3A, 3B and 3C, the schematic device structure, device I–V characteristics, and circuit diagram are shown, respectively, for the low-voltage-trigger lateral SCR (LVTSCR) device which provides input ESD protection. The trigger voltage (current) of the LVTSCR device in an CMOS technology is about ~10V (~10 mA).

The low trigger voltage of the LVTSCR provides effective ESD protection for the CMOS output buffer. However, the lower trigger current may cause the LVTSCR to be accidentally triggered on by external overshooting or undershooting noise pulses on the input or output pins when the CMOS IC is in normal operation.

Referring to FIGS. 4A and 4B, the paths taken by an overshooting noise pulse from the input and output pads, respectively, are shown. Although the overshooting or undershooting voltage on the output pad can be clamped by forward-biased parasitic diodes which exist in the p-n junctions from the drain to the bulk of the output PMOS and NMOS devices, the trigger current of the LVTSCR device is still low for applications in noisy environments. The LVTSCR may be accidentally triggered on by an external electrical noisy pulse, due to the very low turn-on resistance of the LVTSCR, causing the input or output pads to be held at "0" and leading to the malfunction operation in the CMOS IC. Thus, in using the LVTSCR device to provide effective ESD protection for input and output pads of a CMOS IC, the LVTSCR must have a sufficient noise margin relative to the overshooting or undershooting noise pulses for safe normal operation of the CMOS IC's.

OUTPUT ESD PROTECTION CONSIDERATIONS

Referring to FIGS. 5A–5D, a CMOS integrated circuit (IC) 10 housed within a dual-in-line package 12 having input/output pins 14 including VDD pin 14a and VSS pin 14b. Since ESD voltages may have positive or negative polarities on a pad associated with the VDD or the VSS pins 14a, 14b, there are four different ESD-stress mode conditions which can be present at an output pad of the CMOS output buffer.

(1) PS mode: ESD stress at a pin 14c with positive voltage polarity to VSS (GND) pin 14b when VDD pin 14a and other input/output pins 14 are floating (FIG. 5A);

(2) NS mode: ESD stress at a pin 14c with negative voltage polarity to VSS: (GND) pin 14b when VDD pin 14a and other input/output pins 14 are floating (FIG. 5B).

(3) PD mode: ESD stress at a pin 14c with positive voltage polarity to VDD pin 14a when VSS (GND) pin 14b and other input/output pins 14 are floating (FIG. 5C).

(4) ND mode: ESD stress at a pin 14c with negative voltage polarity to VDD pin 14a when VSS (GND) pin 14b and other input/output pins 14 are floating (FIG. 5D).

Any of these ESD voltages can cause damage to the output transistors or the internal circuits of CMOS IC 10. The ESD failure threshold of an output pin is defined as the lowest (in absolute value) ESD-sustained voltage of the four-mode ESD stresses at the pin. For example, if an output pin can sustain ESD voltages as high as 6 KV in the PD- and NS-mode ESD stress conditions, but can only sustain ESD voltages of 1 KV in the ND-or PS-mode ESD stress conditions, the ESD failure threshold for the output pin is defined as 1KV. The following patents describe adding additional ESD-protection elements to the output buffer to improve output ESD robustness:

U.S. Pat. No. 434752, Y.-Y. B. Liu and S. Cagnina, "Electrostatic discharge protection device for CMOS integrated circuit outputs".

U.S. Pat. No. 5019888, D.B. Scott, P.W. Bosshart, and J.D. Gallia, "Circuit to improve electrostatic discharge protection".

U.S. Pat. No. 5218222, G.N. Roberts, "Output ESD protection circuit".

U.S. Pat. No. 5270565, K.F. Lee, A. Lee, M.L. Marmet, and K.W. Ouyang, "electrostatic discharge protection circuit with bimodal resistance characteristics".

U.S. Pat. No. 5329143, T.C. Chan and D.S. Culver, "ESD protection circuit".

But, these patents emphasize connecting the additional ESD-protection elements from the output pad to ground. There is no additional ESD protection element connected between the output pad and VDD. In the ND-mode or PD-mode ESD stresses, the PMOS device of a CMOS output buffer (or the output transistor between VDD and the output pad) is vulnerable to ESD damage and the overall ESD failure threshold is not effectively improved.

Moreover, if no ESD-protection element is connected between the output pad and VDD, unexpected ESD damage to the internal circuits beyond the output PMOS and NMOS devices has been found to occur under the ND-mode ESD stress. This unexpected ESD damage is reported in:

C.C. Johnson, T.J. Maloney, and S. Qawami, "Two unusual HBM ESD failure mechanisms on a mature CMOS process," 1993 EOS/ESD symposium, proceedings, EOS-15, pp. 225–231.

Referring to FIG. 6, a schematic diagram illustrates the unexpected discharging paths from the output to the internal circuits of a CMOS IC 10 under the ND-mode ESD-stress condition (FIG. 5D). The ND-mode ESD-stress voltage on an output pad 20 is first diverted to a floating VSS power line 22 through an output NMOS device 24, before an output PMOS device 26 breaks down to bypass ESD current from the output pad to a VDD pad 28. The diverted negative ESD voltage on the VSS power line 22 will cause voltage stress across the VSS power line 22 and VDD power line 30. If this voltage stress across the VSS and VDD power lines can not be effectively and quickly bypassed through the VDD-to-VSS ESD protection circuit, this ND-mode ESD voltage will unexpectedly cause ESD damage to the internal circuit. Due to parasitic resistances (RDD and RSS) 32, 34 and capacitance (CDD) 36 along the VSS and VDD power lines, as well as the voltage drop on the Vdd-to-Vss ESD protection elements, such an ND-mode ESD stress could damage the internal circuits beyond the output buffer and ESD protection circuits. Thus, a CMOS output buffer for advanced submicron CMOS IC 10 is required to provide effective ESD discharging paths from the output pad to both VSS and VDD pads. This is particularly important for a submicron CMOS VLSI/ULSI with a large die size and long VDD and VSS power lines which often surround the whole chip.

SUMMARY OF THE INVENTION

In this invention, a modified PTLSCR (PMOS-trigger lateral SCR) and a modified NTLSCR (NMOS-trigger lateral SCR) with lower trigger voltage but higher trigger current are provided to reliably and safely protect a CMOS output buffer without being accidentally triggered on by an electrical noisy pulse. With the higher trigger current, the modified PTLSCR and NTLSCR devices remain in their off states and are relatively insensitive to external noisy pulses.

In general, in one aspect, the invention is an output buffer in a CMOS circuit. The output buffer includes an output pad; a VDD line which supplies a first supply voltage; a VSS line which supplies a second supply voltage; a first MOS device connected between the VDD line and the output pad; a second MOS device connected between the VSS line and the output pad; a lateral SCR device connected from the output pad to one of the VDD and VSS lines and in parallel with one of the first and second MOS devices; and a bypass diode connected to one of the VDD and VSS lines and in parallel with the lateral SCR device.

Preferred embodiments include one or more of the following features. The first MOS device is a PMOS device and the second MOS device is an NMOS device. The lateral SCR device is an NMOS lateral SCR device and is connected between the VSS line and the output pad and in parallel with the NMOS device; and the bypass diode has an anode connected to the NMOS lateral SCR device and a cathode connected to the VDD line. Alternatively, the lateral SCR device is a PMOS lateral SCR device and is connected between the VDD line and the output pad and in parallel with the PMOS device; and the bypass diode has a cathode connected to the PMOS lateral SCR device and an anode connected to the VSS line. The output buffer further includes a first junction diode connected in parallel with the PMOS device and having a cathode connected to the VDD line; and a second junction diode connected in parallel with the NMOS device and having an anode connected to the VSS line.

In preferred embodiments, the output buffer includes both an NMOS lateral SCR device and a PMOS lateral SCR device, each connected in parallel with an NMOS and PMOS device, respectively. The PMOS lateral SCR device is connected from the output pad to the VDD line and in parallel with the PMOS device. A bypass diode is connected in parallel to each of the lateral SCR devices. The bypass diode associated with the PMOS lateral SCR device has a cathode connected to the PMOS lateral SCR device and an anode connected to the VSS line.

In general, in another aspect, the invention is a lateral SCR device including a semiconductor substrate of a first doping type; a first well region formed in the substrate, the first well region being of a second doping type which is different from the first doping type; a second well region formed in the substrate, the second well region being of the second doping type and being spaced apart from the first well region so as to define an intermediate region separating the first and second well regions from each other; a first region formed within the first well region, the first region being of one of the first and the second doping types; a second region formed within the second well region, the second region being of the other of the first and second doping types; and a third region formed between the first and second regions, the third region being of the other of the first and second doping types.

In preferred embodiments, the first doping type is p-type and the second doping type is n-type. In this embodiment, the first region is n-type of a higher doping level than the first well region. A first conductor is electrically connected to the first region. The third region extends into the intermediate region between the first and second well regions.

Also, in preferred embodiments, the first and second well regions and the first, second, and third regions are formed by diffusion.

The invention provides an area-efficient output ESD protection circuit having modified PTLSCR and NTLSCR devices and overcomes accidental triggering-on of the LVTSCR devices, due to overshooting or undershooting noise pulses on the output pad. The invention overcomes this problem by increasing the trigger current of the LVTSCR device using a bypass diode which is inserted into the device structure of NMOS-trigger and PMOS-trigger lateral SCRs. The trigger voltage of the modified PTLSCR (NTLSCR) is maintained to be the low snapback-trigger voltage of the short-channel PMOS (NMOS) device which is inserted in the lateral SCR structure. With this arrangement, noise margins of more than ±12V to prevent accidental triggering due to overshooting/undershooting noise pulses on the output pad in the normal operating conditions are achieved. Because the trigger voltage remains low, the modified PTLSCR and NTLSCR devices can be triggered on before the output transistors break down under ESD-stress conditions. The modified PTLSCR and NTLSCR devices can effectively provide a CMOS output buffer with a 4000-V HBM ESD robustness in a relatively small layout area (e.g., $37.6 \times 60 \mu m^2$ in a 0.6 μm CMOS technology).

Moreover, the modified PTLSCR and NTLSCR devices can be formed together with the output PMOS and NMOS devices to reduce layout area in high-density applications. The fabrication of the modified PTLSCR and NTLSCR devices is fully compatible with both CMOS and BiCMOS technologies using either N-well/P-substrate, P well/N-substrate, or twin-well processes.

Other advantages and features will become apparent from the following description of the preferred embodiment and the from the claims.

DESCRIPTION OF THE PREFERRED EMBODIMENTS

The important devices of this invention are a modified PTLSCR (PMOS-trigger lateral SCR) device and a modified NTLSCR (NMOS-trigger lateral SCR) device with lower trigger voltages and higher trigger currents. These modified devices improve the ESD robustness of a CMOS output buffer in submicron CMOS technologies. The lower trigger voltage is achieved by inserting a short-channel thin-oxide PMOS or NMOS devices into the lateral SCR structures to effectively protect the output transistors under ESD-stress conditions. Moreover, the modified PTSCLR and NTSCLR devices also have a higher trigger current to avoid unexpected triggering due to electrical noise on the output pad of the CMOS IC in its normal operating condition. The higher trigger current is achieved by inserting a bypass diode into the structures of the modified PTLSCR and NTLSCR devices. The trigger current of the modified PTLSCR device can be increased up to 225.5 mA while its trigger voltage is maintained at a lower value of 13.4V. The trigger current of the modified NTLSCR device can be increased up to 218.5 mA while its trigger voltage is maintained at a lower value of 11.6V. The noise margin for accidental triggering of the modified NTLSCR device due to overshooting voltage pulses on an output pad, is greater than ±12V. The noise margin for accidental triggering of the modified PTLSCR device due to undershooting voltage pulses on the output pad, an output pad is greater than −12V.

Circuit Configuration

Figure 7:
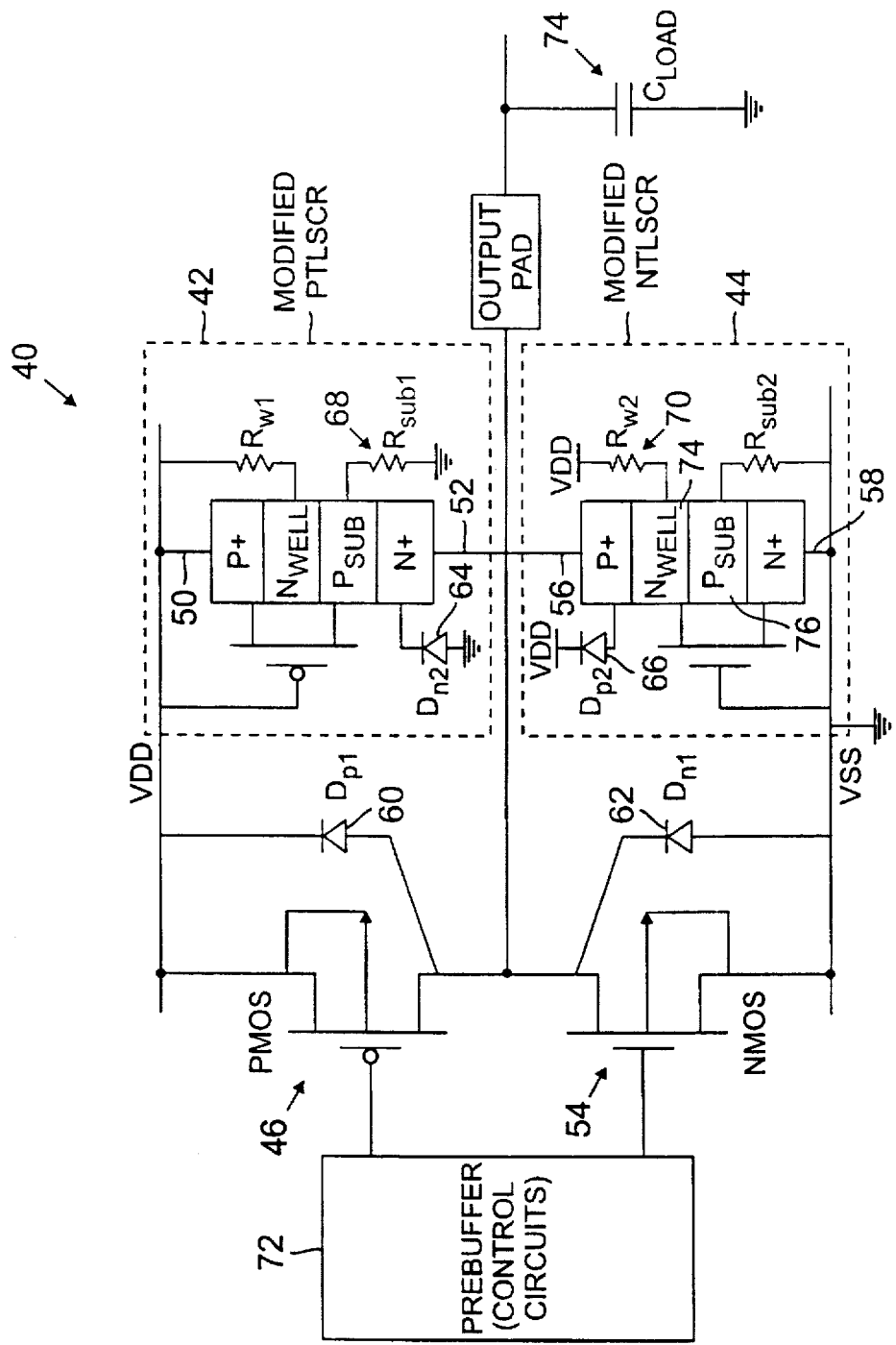
FIG. 7 shows a schematic circuit diagram of a CMOS output buffer protected by modified PTLSCR and NTLSCR devices in accordance with the invention.

Referring to FIG. 7, a schematic circuit diagram of a CMOS output buffer 40 with modified PTLSCR and NTLSCR devices 42, 44 is shown. The modified PTLSCR device 42 is placed in parallel with an output PMOS device 46 from an output pad 48 to the VDD power line. The anode 50 of the modified PTLSCR device 42 is connected to the VDD power line and its cathode 52 is connected to output pad 48. The modified NTLSCR device 44 is placed in parallel with an output NMOS device 54 from output pad 48 to the VSS power line. The anode 56 of the modified NTLSCR device is connected to output pad 48 and its cathode 58 is connected to the VSS power line. The modified PTLSCR device 42 is designed to be "turned-on" to bypass ESD current before output PMOS 46 is damaged by the ND-mode ESD voltage. Similarly, modified NTLSCR device 44 is designed to be "turned-on" to bypass ESD current before output NMOS 54 is damaged by the PS-mode ESD voltage. Because PTLSCR and NTLSCR devices 42, 44 provide high ESD protection capability within a small layout area, the ESD robustness of the CMOS output buffer is significantly improved. Suitably designing the channel length of the PMOS and NMOS devices inserted within the PTLSCR and NTLSCR structures, results in the trigger voltage of the modified PTLSCR and NTLSCR devices, being below the snapback-trigger voltage of the output PMOS and NMOS devices 46, 54, respectively, as described in the above-referenced papers of Chatterjee et al. and M.D. Ker et al. Thus, the modified PTLSCR and NTLSCR devices 42, 44 effectively protect the CMOS output buffer without the need for adding a series resistor to the output buffer as described in U.S. Pat. Nos. 5,019,888, 5,218,222 and 5,270, 565.

Two parasitic junction diodes, Dp1 60 and Dn1 62, also exist in the device structure (the p-n junction between the drain and bulk) of the output PMOS and NMOS devices 46, 54 of the CMOS output buffer. Dp1 and Dn1 diodes 60, 62 are in parallel with the output PMOS and NMOS devices, respectively, with their anodes connected to output pad 48 and VSS, respectively. Dp1 and Dn1 diodes 60, 62, are forward biased in the PD-mode and NS-mode ESD-stress conditions, respectively. The diodes in their forward-biased conditions can sustain high ESD voltage. Thus, the CMOS output buffer 40 often has a much higher ESD robustness in the PD-mode and NS-mode ESD stress conditions than the ESD robustness provided by the modified PTLSCR and NTLSCR devices 42, 44 in PS-mode and ND-mode ESD stress conditions.

Figure 1A:
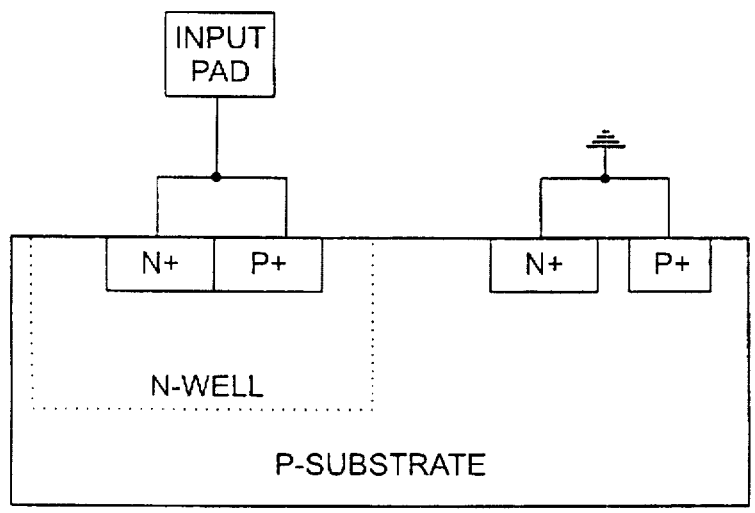
FIGS. 1A, 1B and 1C show the schematic device structure, device I-V characteristics, and circuit diagram, respectively, for a lateral SCR (LSCR) device used as an input ESD protection circuit.
Figure 1B:
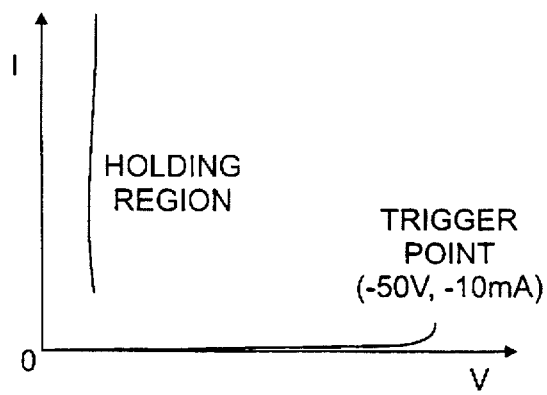
Figure 1C:
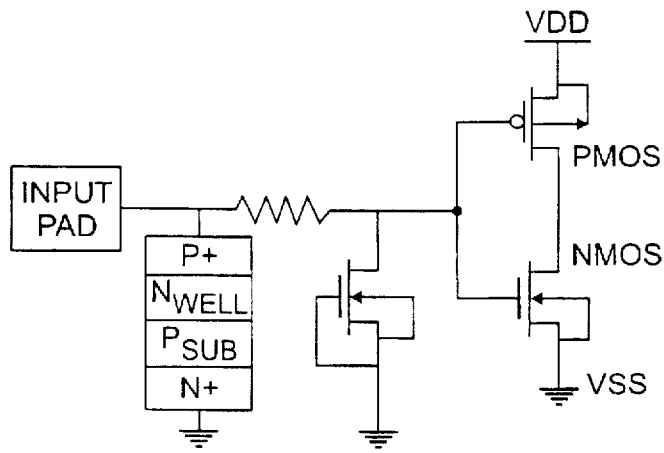
Figure 2A:
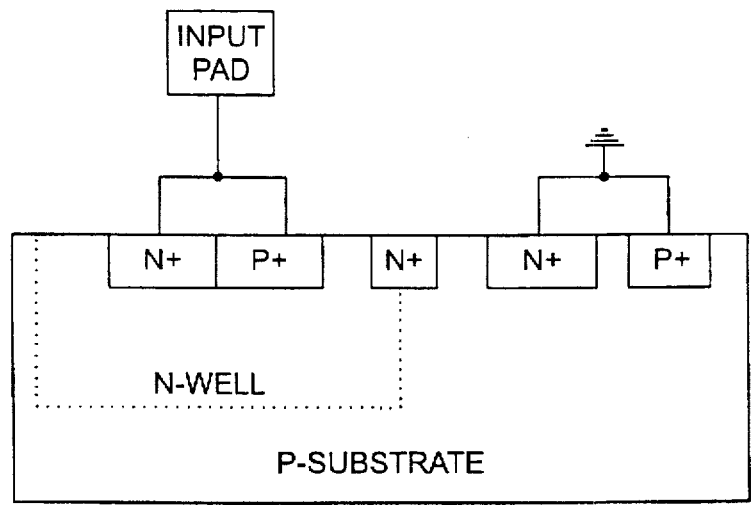
FIGS. 2A, 2B and 2C show the schematic device structure, device I-V characteristics, and circuit diagram, respectively, for a modified lateral SCR (MLSCR) device used as an input ESD protection circuit.
Figure 2B:
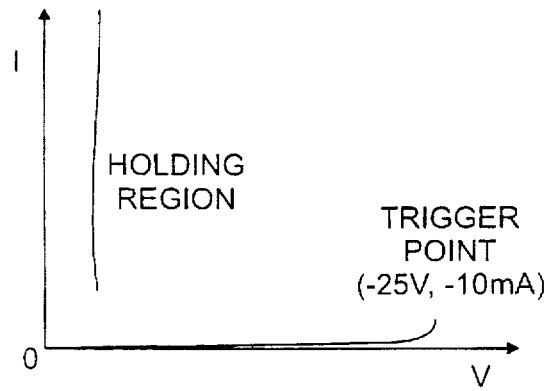
Figure 2C:
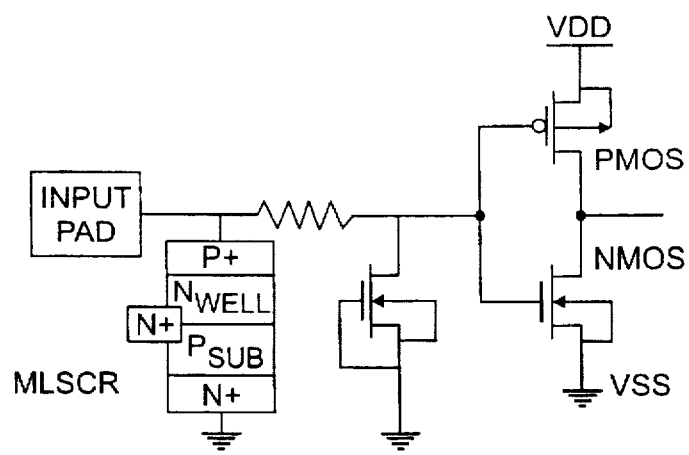
Figure 3A:
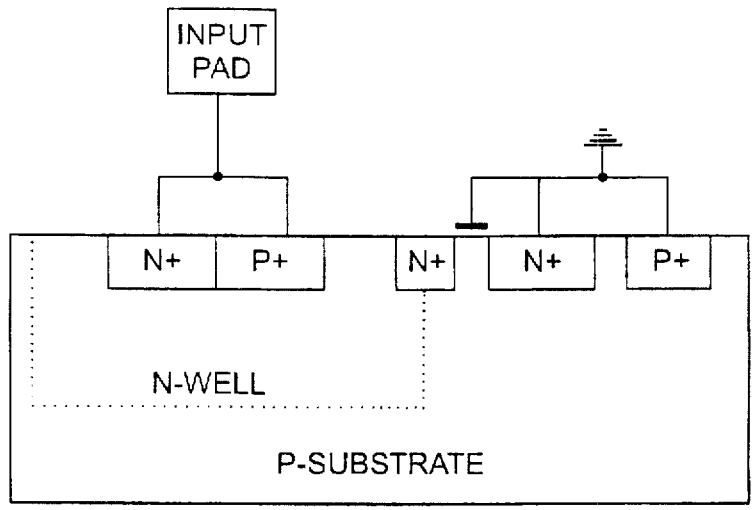
FIGS. 3A, 3B and 3C show the schematic device structure, device I-V characteristics, and circuit diagram for the low-voltage-trigger lateral SCR (LVTSCR) device used as an input ESD protection circuit.
Figure 3B:
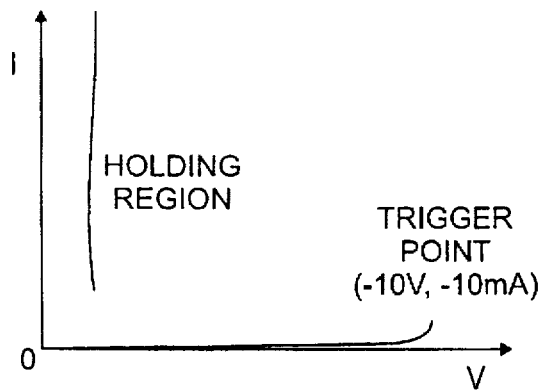
Figure 3C:
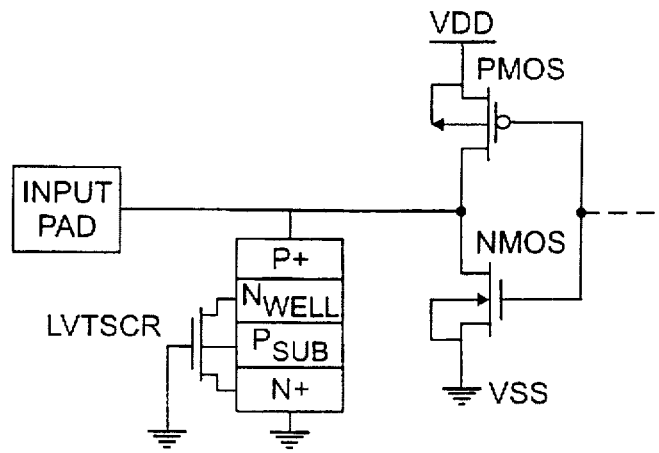
Figure 4A:
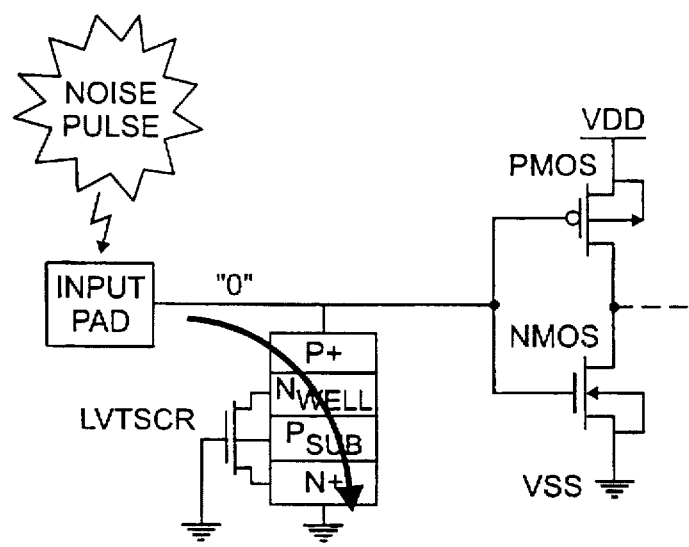
FIGS. 4A-4B show the paths taken by an overshooting noise pulse from the input and output pads, respectively, of a LVTSCR device.
Figure 4B:
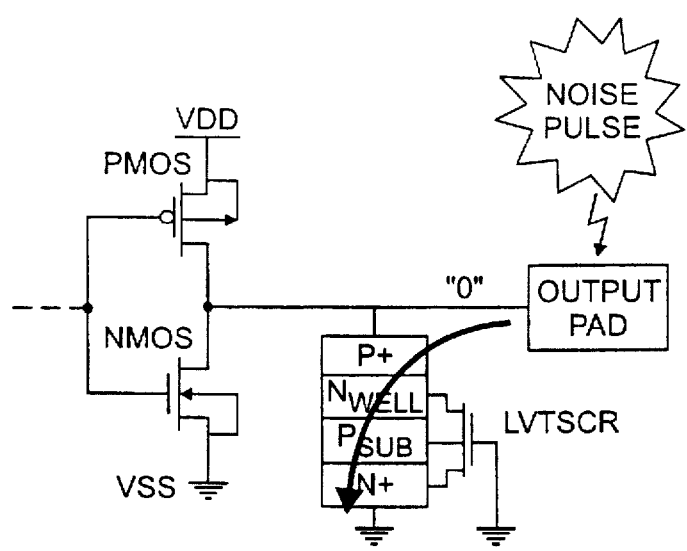
Figure 5A:
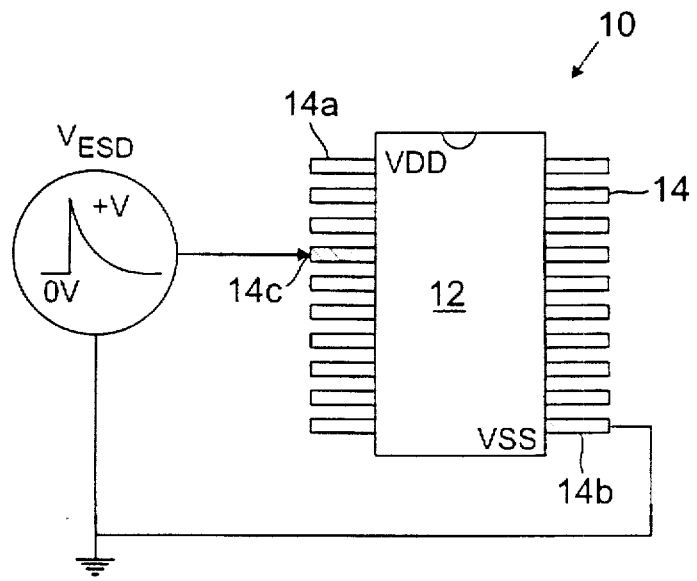
FIGS. 5A-5D show the PS-mode, the NS-mode, the PD-mode, and the ND-mode of ESD-stress conditions, respectively, which can occur at an output pin of a CMOS IC.
Figure 5B:
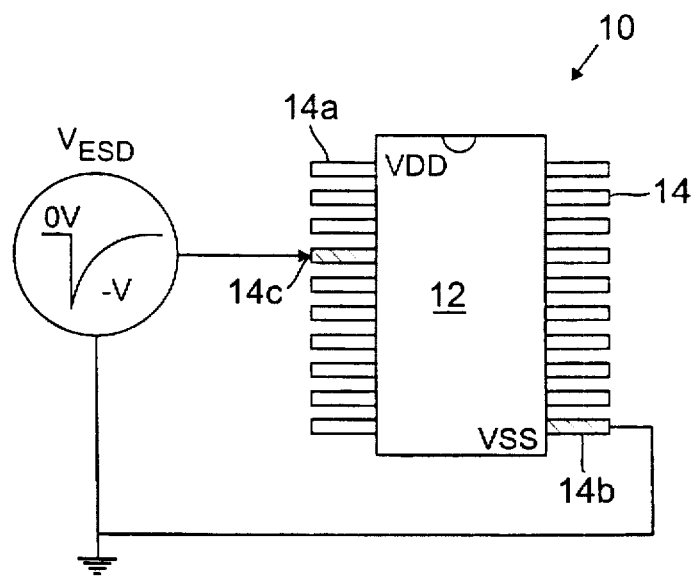
Figure 5C:
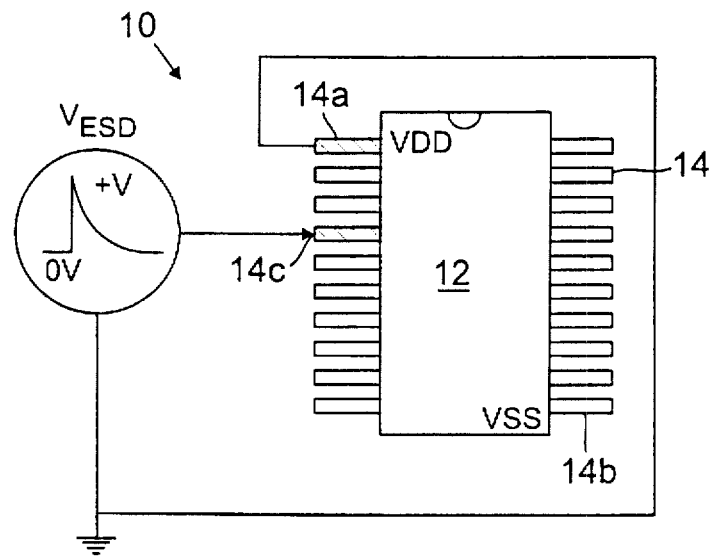
Figure 5D:
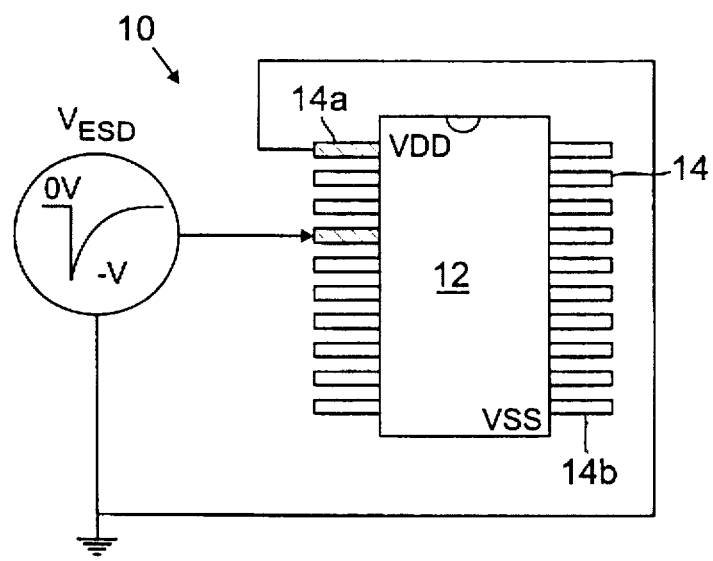
Figure 6:
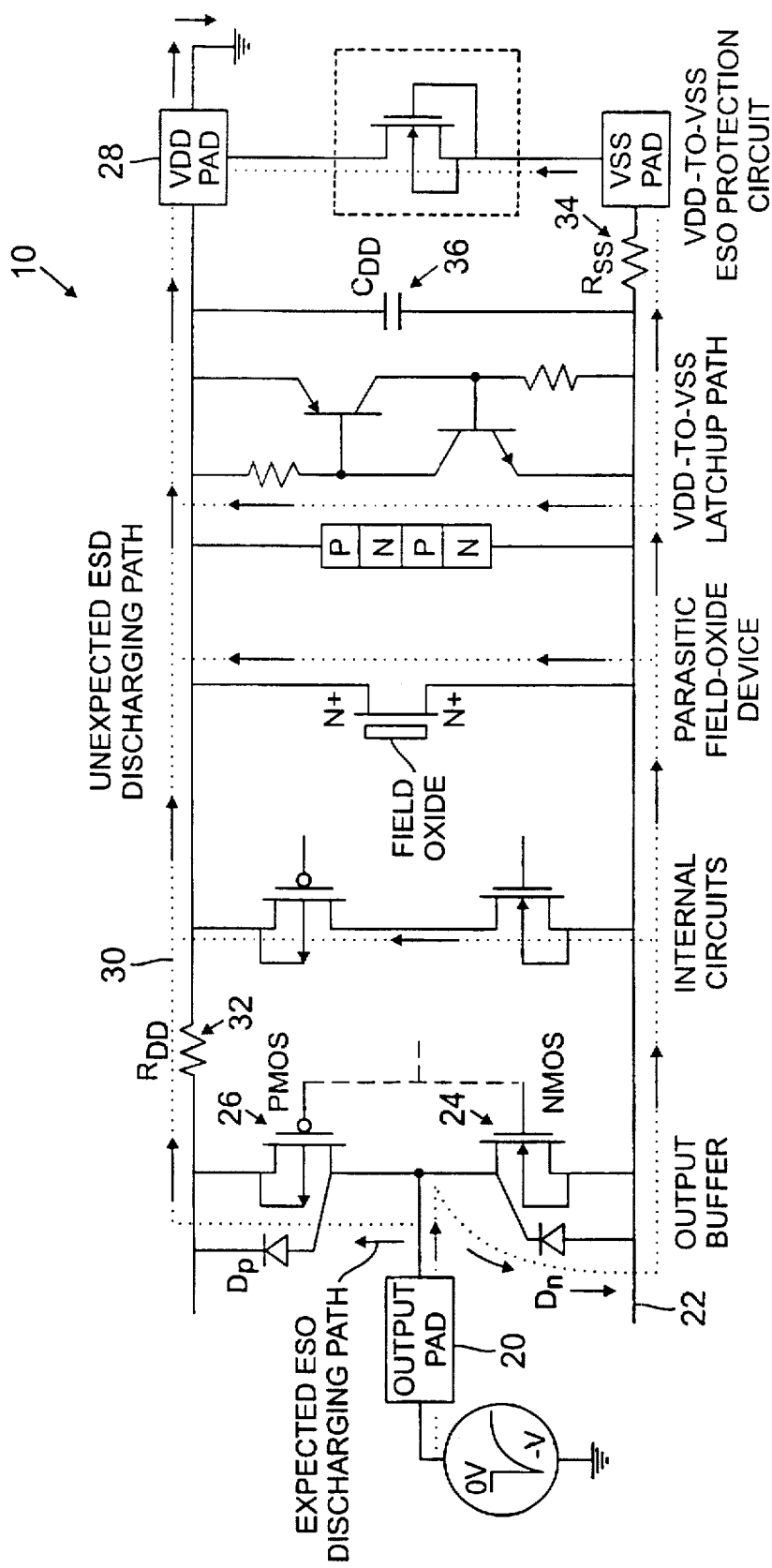
FIG. 6 shows a schematic circuit diagram and discharge paths which can cause unexpected ESD damage to the internal circuits of a CMOS IC beyond its output buffer due to ND-mode ESD stress.

The four modes of ESD stresses on the output pad (see FIGS. 5A–5D) are individually protected by the modified PTLSCR device 42, the modified NTLSCR 44, the Dp1 diode 60, and the Dn1 diode 62, respectively. These devices offer effective and direct discharging paths to quickly bypass the ESD currents from the output pad to VDD or VSS power lines. The low holding voltage (about 1~2 V) of the modified PTLSCR and NTLSCR devices 42, 44 can effectively clamp the ESD voltage on the output pad 48. Particularly in the ND-mode ESD-stress condition (as shown in FIG. 6), modified PTLSCR device 42 with a low holding voltage can effectively bypass the ND-mode ESD current from output pad 48 to VDD without causing the ESD stress across the VDD and VSS power lines. Thus, the internal circuits of the CMOS IC can be fully protected by these modified PTLSCR and NTLSCR devices 42, 44 without causing unexpected internal ESD damage.

Device Structures

Figure 8A:
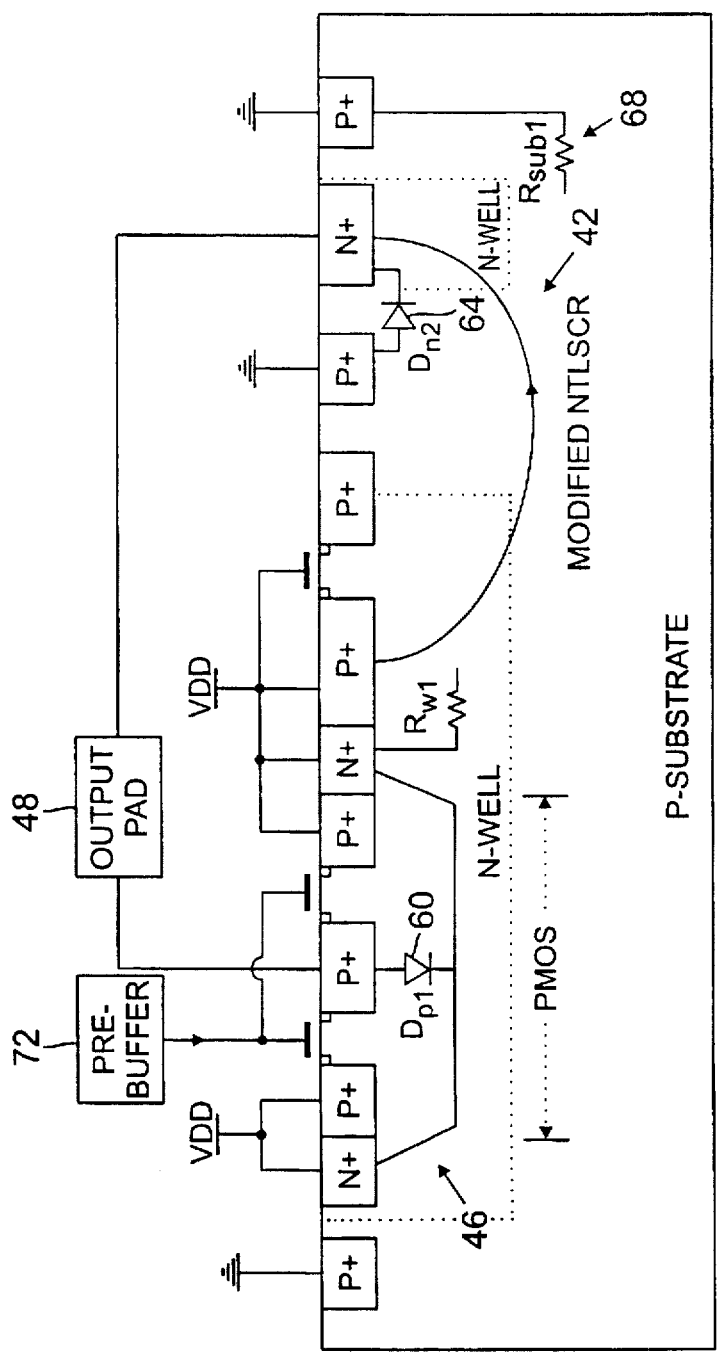
FIGS. 8A and 8B show schematic cross-sectional views of (a) the output PMOS device and the modified PTLSCR device, and (b) the output NMOS device and the modified NTLSCR device, respectively, in a P-substrate N-well CMOS process.
Figure 8B:
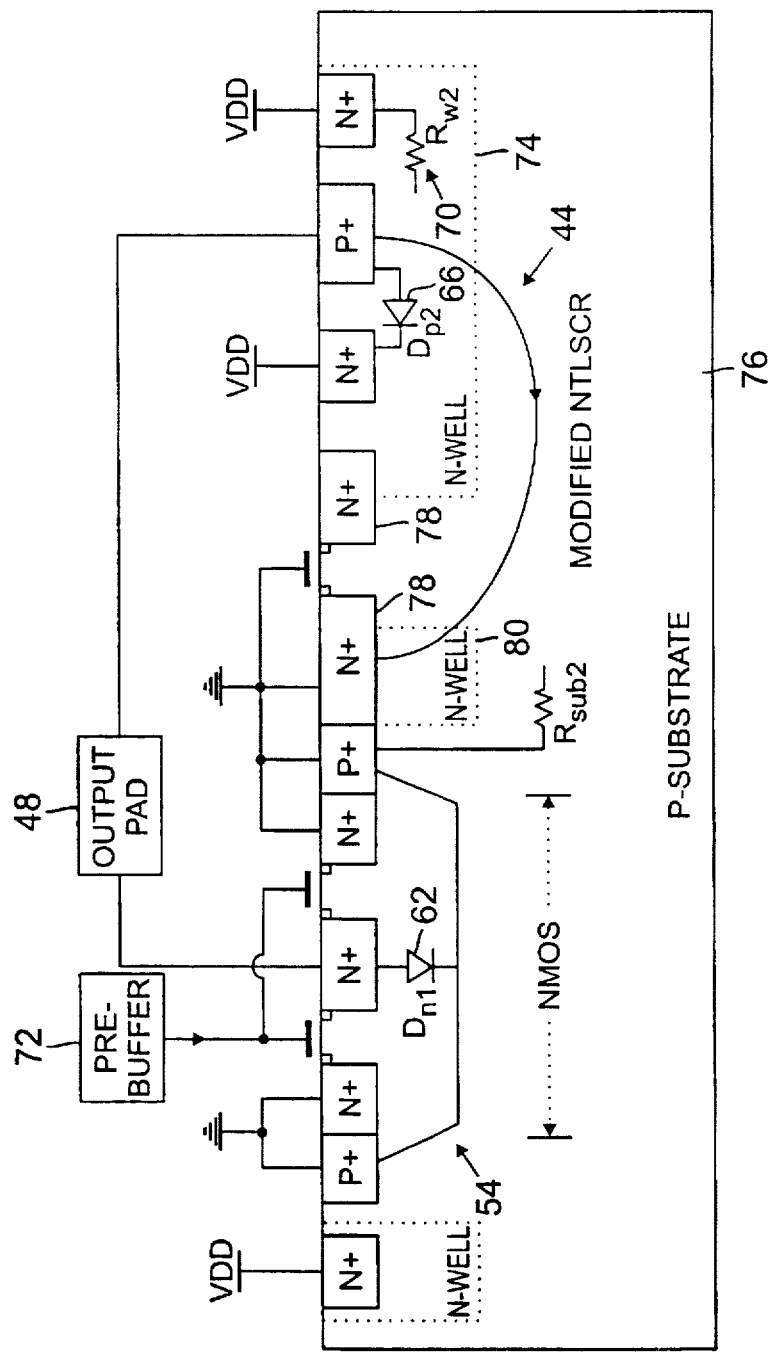

Referring to FIGS. 8A and 8B, schematic cross-sectional views of the modified PTLSCR and NTLSCR devices 42, 44 are shown formed in a P-substrate and N-well CMOS process, respectively. The modified PTLSCR device 42 is formed by inserting a bypass diode Dn2 64 into the PTLSCR structure as shown in FIG. 8A. The modified NTLSCR device 44 is formed by inserting a bypass diode Dp2 66 into the NTLSCR structure as shown in FIG. 8B. The Dn2, Dp2 diodes 64, 66 are located in the latching paths of the modified PTLSCR and NTLSCR devices, respectively. Dn2 and Dp2 diodes effectively reduce the equivalent substrate resistance (Rsub1) 68 and N-well resistance (Rw2) and effectively bypass the latchup trigger current in the P-substrate and the N-well, respectively. Thus, the trigger current required to initiate the positive-feedback regenerative process of latchup in the modified PTLSCR and NTLSCR devices can be significantly increased. This latchup process is described in greater detail in the following references which are incorporated by reference:

M.D. Ker and C.Y. Wu. "Modeling the positive-feedback regenerative process of CMOS latchup by a positive transient pole method : Part I—theoretical derivation," IEEE Trans. on Electron Devices, vol. 42, no. 6, pp. 1141–1148, Jun., 1995.

M.D. Ker and C.Y. Wu. "Modeling the positive-feedback regenerative process of CMOS latchup by a positive transient pole method: Part II—quantitative evaluation," IEEE Trans. on Electron Devices, vol. 42, no. 6, pp. 1149–1155, Jun., 1995.

The trigger voltages of the modified PTLSCR and NTLSCR devices 42, 44 are kept the same as the snapback-trigger voltage of the short-channel output PMOS and NMOS devices of the PTLSCR and NTLSCR structure. By adding bypass diodes Dn2 and Dp2, the trigger voltage of the modified PTLSCR and modified NTLSCR devices are still the same as that of unmodified PTLSCR and NTLSCR devices, but the trigger current of the modified PTLSCR (modified NTLSCR) can be significantly increased to avoid accidental triggering by external noisy pulses. If the modified PTLSCR and modified NTLSCR devices 42, 44 are triggered on, they will enter into their latching states with a holding voltage similar to the original holding voltage (about 1~2 V) of a lateral SCR device to clamp the ESD voltage across their respective output transistors.

By increasing the trigger current of the modified PTLSCR device 42 and modified NTLSCR device 44 without increasing their trigger voltage, these modified PTLSCR and NTLSCR devices provide excellent ESD protection to CMOS output buffer 40. With the higher trigger current of the modified PTLSCR and NTLSCR devices, as well as the voltage-clamping effect of the forward-biased diodes Dp1 60 and Dn1 62, modified PTLSCR and NTLSCR devices 42, 44 are guaranteed to be in their off states when the CMOS IC is in its normal operating condition even if there are overshooting or undershooting noisy pulses present on an output pin.

As shown in FIGS. 8A and 8B, the modified PTLSCR and modified NTLSCR devices 42, 44 can be consolidated within the layout of the output PMOS and NMOS devices 46, 54, respectively, to reduce layout area.

In one example of a merged layout of a CMOS output buffer having modified PTLSCR and NTLSCR devices including latchup guard rings, the output PMOS device has a dimension (W/L) of 312/1.0 (μm/μm) and the output NMOS device has a dimension of 300/1.0. The device dimension of the short-channel PMOS (NMOS) inserted in the modified PTLSCR (NTLSCR) is 60/0.8. The layout area of the modified PTLSCR (NTLSCR) is 60×37.6 μm². The total layout area of the output PMOS (NMOS) merged with the modified PTLSCR (NTLSCR) including double latchup guard rings is 114.4×86 μm².

These modified PTLSCR and NTLSCR can also be implemented in any P-well/N-substrate CMOS technology.

Circuit Operating Principles

CMOS Normal-Operating Conditions:

In normal CMOS operation, the VDD power line is biased at 3V for low-voltage application and the VSS power line is grounded. In this condition, the modified PTLSCR and NTLSCR devices 42, 44 are kept off due to the gates of the inserted short-channel PMOS and NMOS being connected to their sources. The CMOS output buffer is controlled by the pre-buffer circuits 72 to drive/sink current to/from the external output load 74 (represented by $C_{Load}$)

Diode Dp1 60 and diode Dn1 62 contribute a voltage-level clamping effect on output pad 48. The Dp1 and Dn1 diodes clamp the high-level (low-level) voltage of the output signal to about VDD+0.6V and VSS−0.6V, respectively. Thus, the voltage level of output signals on output pad 48 is clamped between about 3.6V and −0.6V in normal CMOS operations with 3V VDD and 0V VSS. If an unexpected noisy pulse is present at the output pad, the overshooting or undershooting voltage/current can be bypassed by diode Dp1 60 and diode Dn1 62. The modified PTLSCR and NTLSCR devices 42, 44 with higher trigger current have a sufficient noise margin, so that the modified PTLSCR and NTLSCR devices 42, 44 are not triggered on by the external noisy pulse under the clamping guard of diode Dp1 60 and diode Dn1 62.

ESD-Stress Conditions:

Referring again to FIG. 7, when a PS-mode ESD event occurs (see FIG. 5A), the ESD voltage is diverted to the anode 56 of the modified NTLSCR device 44, and then to the drain of the inserted short-channel NMOS. When the drain voltage is high enough, the inserted short-channel NMOS device is first turned-on by means of drain snapback breakdown. Referring to FIG. 8B, when the drain snapback breakdown occurs in the inserted short-channel NMOS, ESD current is conducted from the N-well 74, through the snapbackbreakdown drain of the inserted NMOS to the P-substrate 76, and then to the N+ diffusion 78 in the adjacent N-well 80. This conducting current from the N-well 74 to the P-substrate 76 leads to the self-regeneration of latchup in the modified NTLSCR device 44. Once latchup occurs in the modified NTLSCR device, a path with very low impedance from output pad 48 to the VSS power line is created. Then, the ESD current is discharged primarily through the lateral SCR structure in the modified NTLSCR device 44. The positive ESD voltage on output pad 48 is clamped to near the holding voltage (about 1–2) of the modified NTLSCR device 44, so the output transistors are effectively protected by the modified NTLSCR device 44. Due to its capability in delivering high power, the modified NTLSCR device 44 can sustain high ESD stress in a small layout area with a lower trigger voltage. To ensure that the modified NTLSCR device 44 is turned-on before the output NMOS 54 breaks down, the channel length of the inserted NMOS is shorter than that of the output NMOS.

When an NS-mode ESD event (FIG. 5B) occurs, the parasitic diode Dn1 62 in the output NMOS 54 is forward biased and turned-on to bypass ESD current. The negative ESD voltage on the pad is clamped by the forward-biased Dn1 62 to about −0.6V. When a PD-mode ESD event (FIG. 5C) occurs, the parasitic diode Dp1 60 in the output PMOS is forward turned on to bypass ESD current. The positive ESD voltage on the pad is clamped by the forward biased Dp1 60 to about +0.6V. The diodes Dn1 and Dp1 in the forward-biased condition can perform high ESD protection for the output transistors.

When an ND-mode ESD event occurs (FIG. 5D) at output pad 48 with VDD power line grounded, the negative ESD voltage is diverted to the cathode 52 of the modified PTLSCR device 42, and then to the drain of the inserted short-channel PMOS. When the negative ESD voltage on the drain is low enough, the modified PTLSCR device is triggered on by means of the drain snapback breakdown in the inserted PMOS. Once the modified PTLSCR device 42 is triggered on, a path with very low impedance from VDD to the output pad is created. Then, the ESD current is discharged primarily through the modified PTLSCR device. The negative ESD voltage on output pad 48 is clamped to near the holding voltage (about −1V) of the modified PTLSCR device. This PTLSCR device can effectively protect the CMOS output buffer from ND-mode ESD damage. Due to its capability of delivering high power, the modified PTLSCR device 42 can sustain high ESD stress in a small layout area with a lower trigger voltage. To ensure that the modified PTLSCR device 42 is turned-on before the output PMOS 46 breaks down, the channel length of the inserted PMOS should be shorter than that of the output PMOS device 46.

Device I–V Characteristics

Figure 9A:
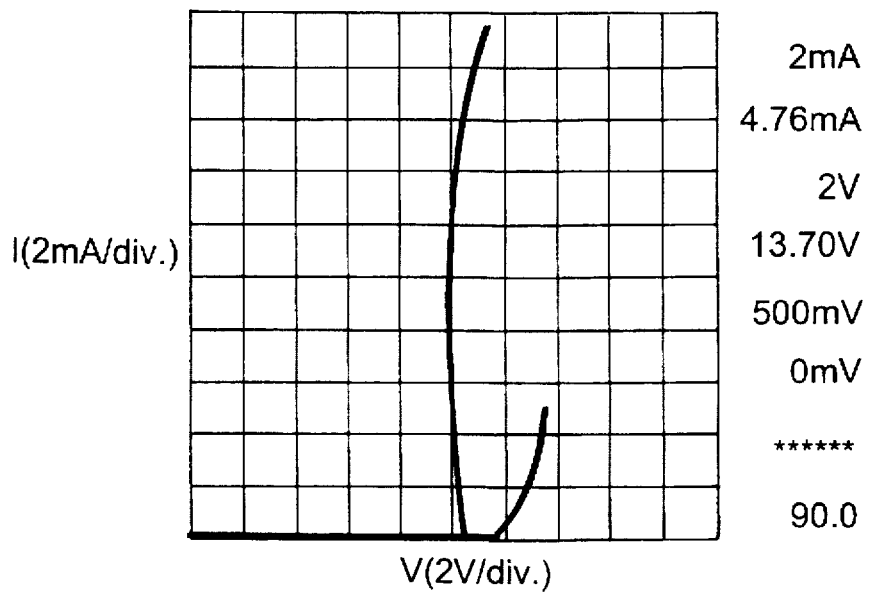
FIGS. 9A and 9B show typical I-V characteristics of (a) the output NMOS device; and (b) the modified NTLSCR device.

The Modified NTLSCR device:

A typical I–V characteristic of an output NMOS device with a channel length of 1.0 μm is shown in FIG. 9A. The snapback trigger voltage (current) of the output NMOS was 13.7V (4.76 mA) and the snapback holding voltage (current) was 9.78V (5.42 mA).

Figure 9B:
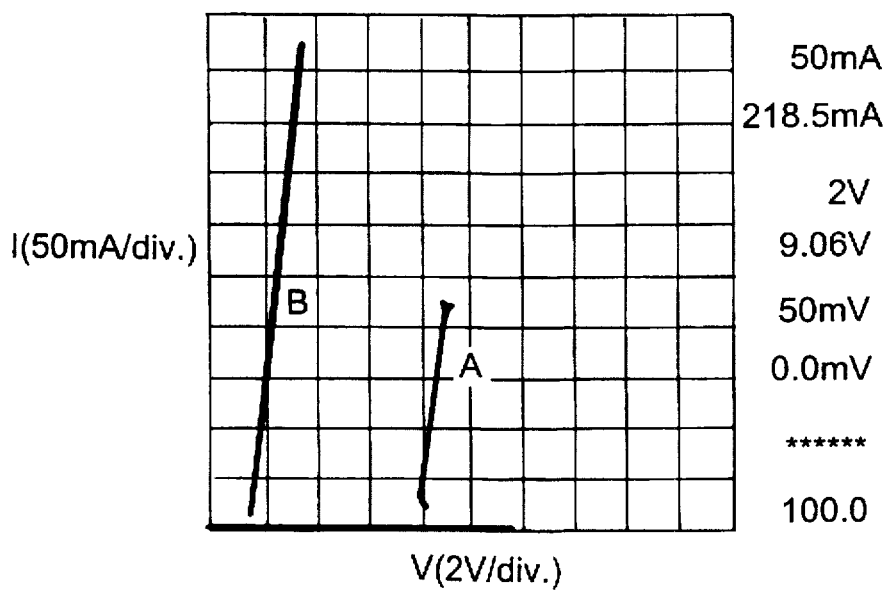

A typical I–V curve characteristic of a modified NTLSCR device is shown in FIG. 9B. The channel length of the NMOS inserted into the modified NTLSCR is 0.8μm. In FIG. 9B, the modified NTLSCR device has two trigger points in its I–V characteristic. The first trigger point is due to the drain snapback break down of the inserted NMOS. The first trigger voltage (current) is 11.6V (2.0 mA). Due to the presence of the bypass diode Dp2, there is a buffer region in the I–V characteristics (marked as "A" in FIG. 9B) before the lateral SCR in the modified NTLSCR is triggered on. Region A is the snapback region of the inserted NMOS. As the applied current is further increased, the lateral SCR in the modified NTLSCR will be finally triggered on. Thus, there is a second trigger point in the I–V curve of FIG. 9B. The measured second trigger current (voltage) in the modified NTLSCR device is as high as 218.5 mA (9.06V). After the second trigger point, the I–V curve enters into the latchup holding region (marked as "B" in FIG. 9B), which is due to the latching action of the lateral SCR structure in the modified NTLSCR device. The minimum holding voltage (current) of region B is as low as 1.34V (12.5 mA).

Modified NTLSCR device can be safely operated in the snapback region (Region A) without causing any damage.

With this buffer region A, the modified NTLSCR device is not triggered on by the external noisy pulse, but the modified NTLSCR device (with the first trigger voltage of 11.6V) is ensured to be turned-on before the output NMOS (with a breakdown voltage of 13.7V) breaks down in the PS-mode ESD-stress condition. Thus, the modified NTLSCR device can effectively protect the output NMOS device from ESD damage. The holding voltage of the modified NTLSCR device is still as low as that of a conventional NTLSCR device, but the trigger current (218.5 mA) of the modified NTLSCR is much higher than that (12.3 mA) of the conventional NTLSCR device. With the modified device structure of FIG. 8B, the modified NTLSCR device can provide the CMOS output buffer with the same ESD protection as that of a conventional NTLSCR device. Moreover, the modified NTLSCR device is not triggered on by the external noisy pulse on the output pad as is the case with the CMOS output buffer in its normal operating condition.

Figure 10A:
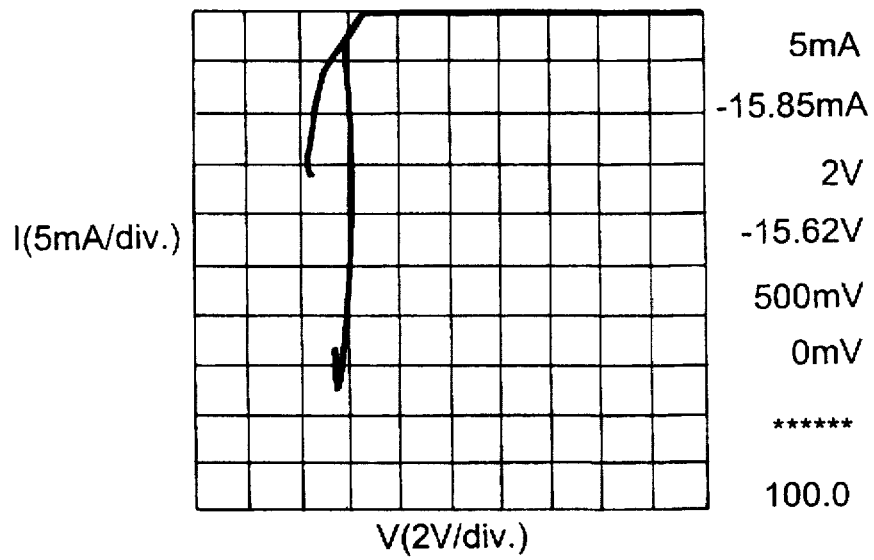
FIGS. 10A and 10B show typical I-V characteristics of (a) the output PMOS device; and (b) the modified PTLSCR device.

The Modified PTLSCR device:

A typical I-V characteristic of the output PMOS device with a channel length of 1.0 μm is shown in FIG. 10A. In FIG. 10A, the snapback trigger voltage (current) of the output PMOS device is −15.62V (−15.85 mA) and the snapback holding voltage (current) is −13.84V (−13.9 mA).

The modified PTLSCR device also has two trigger points in its I-V characteristic. The first voltage trigger is due to the drain snapback breakdown of the inserted PMOS. The first trigger voltage (current) is −13.42V (−15 mA). Due to the presence of the bypass diode Dn2, there is a buffer region in the I-V characteristic (marked as "C" in FIG. 10B) before the lateral SCR in the modified PTLSCR is triggered on. The presence of this region C is owed to the bypass diode Dn2 and the inserted PMOS in the device structure of the modified PTLSCR. As the applied negative current is further increased, the lateral SCR in the modified PTLSCR device can be finally triggered on to provide a second trigger point in the I-V curve of FIG. 10B. The second trigger current (voltage) in the modified PTLSCR device is as high as −225.5 mA (−6.14V). After the second trigger point, the I-V curve enters into the latchup holding region (marked as "D" in FIG. 10B), which is due to the latching action of the lateral SCR structure in the modified PTLSCR device. The minimum holding voltage (current) in the region D is as low as −1.72V (−13.5 mA).

Figure 10B:
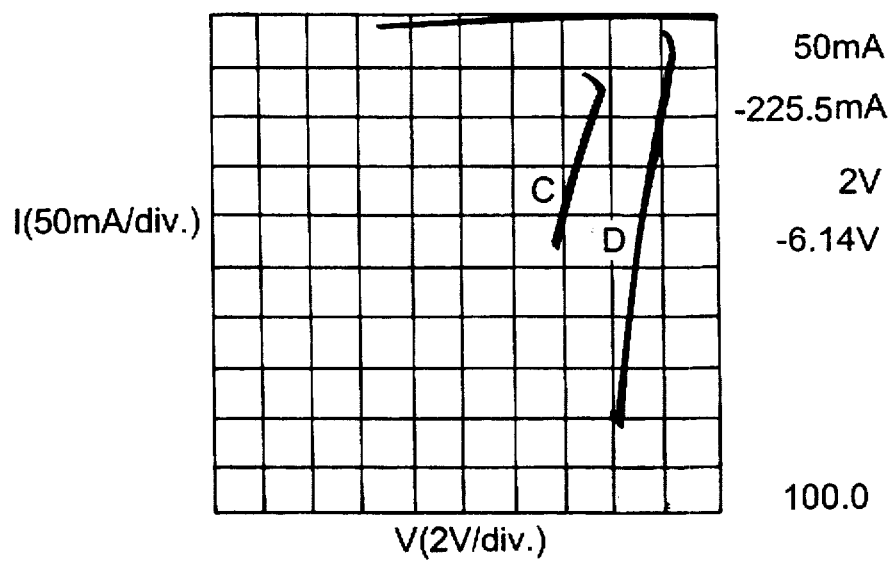

In snapback region C of FIG. 10B, the modified PTLSCR device can be safely operated without causing any damage. With this buffer region C, the modified PTLSCR device is not triggered on by the external noisy pulse, but can be triggered on by the ESD pulse. Comparing the I-V curves of FIGS. 10A and 10B, the modified PTLSCR device (with the first trigger voltage of −13.42V) is ensured to be turned on before the output PMOS (with a breakdown of voltage of −15.62V) breaks down in the ND-mode ESD-stress condition. Thus, the modified PTLSCR device effectively protects the output PMOS device against ESD damage. The holding voltage of the modified PTLSCR device is still as low as that of a conventional PTLSCR device, but the trigger current (−225.5 mA) of the modified PTLSCR is much higher, in the magnitude, than that (−4.7 mA) of the conventional PTLSCR device. By using the device structure in FIG. 8A, the modified PTLSCR device can provide the CMOS output buffer with the same ESD protection as that of a conventional PTLSCR device. Moreover, it has a safe margin against the triggering due to the external noisy pulse on the output pad while the CMOS output buffer is in its normal operation condition.

Other embodiments are within the following claims:

What is claimed is:

1. An output buffer in a CMOS circuit, said output buffer comprising:

an output pad;

a VDD line which supplies a first supply voltage;

a VSS line which supplies a second supply voltage;

a first MOS device connected between the VDD line and the output pad;

a second MOS device connected between the VSS line and the output pad; and a lateral SCR device connected from the output pad to one of the VDD and VSS lines and in parallel with one of the first and second MOS devices; and a bypass diode connected to the other of the VDD and VSS lines and to the lateral SCR device, the bypass diode connected and configured to increase the current required to trigger the SCR device.

2. The output buffer of claim 1 wherein the first MOS device is a PMOS device and wherein the second MOS device is an NMOS device.

3. The output buffer of claim 2 wherein the lateral SCR device is an NMOS lateral SCR device and is connected between the VSS line and the output pad and in parallel with the NMOS device; and the bypass diode has an anode connected to the NMOS lateral SCR device and a cathode connected to the VDD line.

4. The output buffer of claim 3 further comprising:

a PMOS lateral SCR device connected from the output pad to the VDD line and in parallel with the PMOS device; and a second bypass diode having a cathode connected to the PMOS lateral SCR device and an anode connected to the VSS line.

5. The output buffer of claim 2 wherein the lateral SCR device is a PMOS lateral SCR device and is connected between the VDD line and the output pad and in parallel with the PMOS device; and the bypass diode has a cathode connected to the PMOS lateral SCR device and an anode connected to the VSS line.

6. The output buffer of claim 2 further comprising:

a first junction diode connected in parallel with the PMOS device and having an cathode connected to the VDD line; and a second junction diode connected in parallel with the NMOS device and having an anode connected to the VSS line.

7. The output buffer of claim 1 wherein the bypass diode is on the latching path of the lateral SCR device.

* * * * *